United States Patent [19]
Bhagat

[11] Patent Number: 4,630,092
[45] Date of Patent: Dec. 16, 1986

[54] INSULATED GATE-CONTROLLED THYRISTOR

[75] Inventor: Jayant K. Bhagat, Troy, Mich.

[73] Assignee: General Motors Corporation, Detroit, Mich.

[21] Appl. No.: 667,845

[22] Filed: Nov. 2, 1984

Related U.S. Application Data

[63] Continuation-in-part of Ser. No. 617,106, Jun. 4, 1984.

[51] Int. Cl.[4] .................. H01L 29/72; H01L 27/06; H01L 29/08; H01L 29/06
[52] U.S. Cl. ....................... 357/38; 357/43; 357/56
[58] Field of Search ............... 357/38, 43, 56

[56] References Cited

FOREIGN PATENT DOCUMENTS 0228793 1/1980 U.S.S.R. .................. 357/38

OTHER PUBLICATIONS

Russell et al., "The COMFET-a New High Conductance MOS-Gated Device" *IEEE Electron Device Letters*, vol. EDL-4, No. 3, Mar. 1983, pp. 63-65.

*Primary Examiner*—William D. Larkins
*Assistant Examiner*—John Lamont
*Attorney, Agent, or Firm*—Robert J. Wallace

[57] ABSTRACT

A new semiconductor power device, suitable for electrical switching in automotive applications, is proposed. This device combines the low specific on-resistance achievable with bipolar regenerative switching devices with the convenience of insulated gate control of not only turn-on but also turn-off. A device structure is presented that also includes a pinch resistance effect to more rapidly produce turn-off.

4 Claims, 8 Drawing Figures

INSULATED GATE-CONTROLLED THYRISTOR

RELATED PATENT APPLICATION

This patent application is a continuation-in-part of my U.S. patent application Ser. No. 617,106, entitled "Integrated Field Controlled Thyristor Structure with Grounded Cathode" that was filed on June 4, 1984 and is assigned to the assignee of this invention.

FIELD OF THE INVENTION

This invention relates to thyristor structures and more particularly to a dual gate silicon controlled rectifier in which one gate is used for device turn-on and the other gate is used for device turn-off.

BACKGROUND OF THE INVENTION

Numerous semiconductor devices can be used as power switches. These devices include thyristors, bipolar junction transistors, junction field effect transistors, insulated gate field effect transistors, field controlled thyristors, insulated gate-controlled thyristors, and bipolar mode conductivity modulated field effect transistors. The choice of which device is preferred for a particular application is a function of many factors. These factors include the desired current handling capability of the device, the forward and reverse blocking voltages desired, turn-on and turn-off time desired, typical and maximum switching frequencies desired, circuit environment considerations such as resistive/inductive loads encountered, drive requirements, cost, etc.

Some applications of power switches require switching of low voltages at high currents. For example, automotive applications require switching of approximately 12 volts at currents of about 10–100 amperes. Using semiconductor devices rather than electromechanical relays to do this switching offers advantages of reliability, cost and ease of use in interfacing with control circuitry. Such advantages are obviously significant.

There are several characteristics which are particularly desirable in thyristor devices used for automotive switching applications. Such characteristics include a grounded cathode for compatibility with the automotive electrical system and control by means of low current and low positive voltages. This provides simpler interfacing and better electrical compatibility with other circuits in the automotive system. In addition, it is desired that the thyristor not only be rapidly turned on, but also rapidly turned off, by the low power positive control voltages. Low cost is very important too. In order to achieve low cost, a high current density device with a low on-resistance is desired. This minimizes silicon chip area in the device and thereby improves yields, while keeping heat sinking and packaging costs to a minimum.

The known type of thyristor having an insulated gate for turn-on has most of the foregoing desirable features. However, it cannot be turned off unless current density drops to a very low value. I have found how to add an insulated gate to such a device that provides rapid turn-off even when anode voltage stays high.

OBJECTS AND SUMMARY OF THE INVENTION

It is an object of this invention to provide a dual gate grounded cathode thyristor in which one gate turns the thyristor on and the other turns the thyristor off.

Another object of the invention is to provide a new semiconductor power device suitable for electrical switching in automotive applications.

A further object of the invention is to provide a semiconductor power device having low specific on-resistance characteristics of bipolar regenerative switching devices, in combination with the convenience of insulated gate control of both turn-on and turn-off.

The invention comprehends a dual gate thyristor in which a turn-on gate is part of a first integrated insulated gate field effect transistor (IGFET) and a turn-off gate is part of a second integrated insulated gate field effect transistor (IGFET). The thyristor further includes a pinch resistance effect for accelerating turn-off, which effect is produced in one example of the invention by a ring-like source region of the second IGFET that encircles a current flow path in the thyristor.

BRIEF DESCRIPTION OF THE DRAWING

Other objects, features and advantages of this invention will become more apparent from the following description of preferred examples thereof and from the drawing, in which.

DESCRIPTION OF THE PREFERRED EMBODIMENTS

One embodiment of this invention comprehends a PNPN rectifier structure that has a grounded cathode and two insulated control gates, one for turn-on and one for turn-off. I refer to the rectifier as a thyristor since it is fundamentally a bipolar type of device that uses conductivity modulation to handle high current densities and provide a low specific on-resistance. The control gates are actually gate electrodes of separate integral insulated gate field effect transistors (IGFETs) and controlled with positive electrical potentials. In addition, my thyristor structure provides a pinch resistance, analogous in operation to a junction field effect transistor that is activated by the turn-off control gate. As hereinbefore mentioned, insulated gates have been used to turn on thyristors. However, such thyristors can only be turned off when current density drops to a low value. My thyristor additionally has a second insulated gate and a pinch resistance to provide turn-off even though current density does not decrease. The extra complexity introduced into the structure by using two control terminals and the pinch resistance is not considered to be significant when one considers the advantage obtained, particularly for microprocessor controlled applications.

Figure 1:
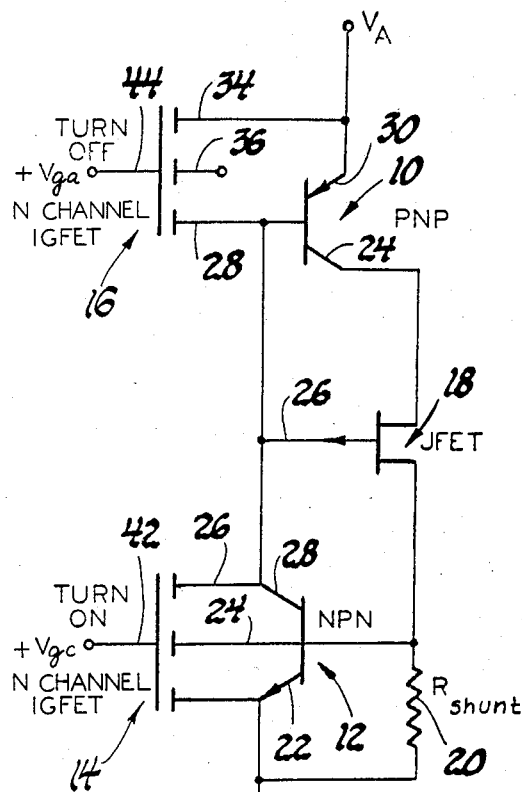
FIG. 1 shows an electrical schematic of the thyristor of this invention.

Reference is now made to FIG. 1, which shows an electrical schematic that represents the integrated electrical devices inherent to my thyristor. My thyristor can thus be considered as including a PNP transistor 10, an NPN transistor 12, a first insulated gate field effect transistor (IGFET) 14, and a second insulated gate field effect transistor (IGFET) 16. It also includes a pinch resistance, which I prefer to refer to as a junction field effect transistor (JFET) 18. FIG. 1 also shows a resistance 20, that is identified as $R_{shunt}$. Resistance 20 is an internal resistance, between the emitter and the base of the NPN transistor, that is used in the normal and accepted way to produce device turn-on when IGFET 14 is activated.

Figure 2:
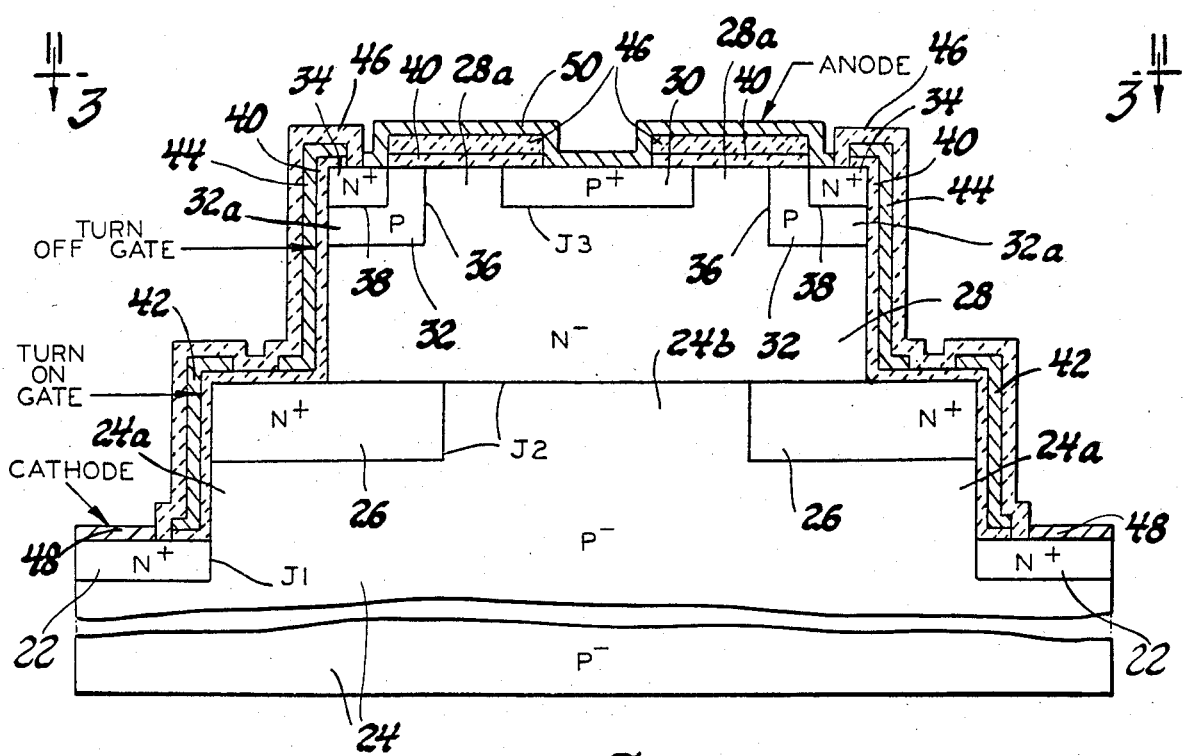
FIG. 2 shows a cross-sectional view of a thyristor made in accordance with this invention.

Reference is now made to FIG. 2 which shows a specific embodiment of the thyristor electrically represented by FIG. 1. The embodiment is not drawn to scale, to make illustration easier. The structure shown in FIG. 2 is fundamentally concentric. Hence, it is symmetrical about its vertical centerline. In particular, FIG. 2 shows a rectangular P− silicon body member 24 having a reduced cross-section zone on its edge that forms a step. An N− layer 28 on the P− body 24 provides a second reduced cross-section zone, that forms a second step on the periphery of the device. The top surface of the device forms a third step. The tread-portion of the lowest step on silicon body 24 has a ring-like N+ region 22 on its circumference. The tread-portion of the middle step has a middle ring-like N+ region 26. It can be considered that the middle N+ ring 26 is disposed on the periphery of the upper surface of P− body 24, so that it encircles a current flow portion 24b of body 24. A spacing between the lower N+ ring 22 and the middle N+ ring 26 should be maintained to insure that there is adequate shunt resistance 20 between PN junction J2 and cathode 22. For a doping level of about $1 \times 10^{14}$ or $1 \times 10^{15}$ impurity atoms per cubic centimeter in P− region 24, I would like this spacing to be at least of the order of 10 micrometers, preferably 30. An N− epitaxial layer 28 of the order of about 500–1,000 micrometers wide and about 20–50 micrometers thick is disposed on the upper surface of the P− body 24, over its central portion 24b and overlapping onto the inner circumferential portion of the middle N+ region 26. N− layer 28 could have a doping level of about $1 \times 10^{14}$ or $1 \times 10^{15}$ impurity atoms per cubic centimeter. The preferred width of layer 28 depends on the current capability desired for the device and the bonding wire diameter that is to be used. The preferred thickness of layer 28 depends upon the voltage breakdown characteristic desired. The range in width and thickness given is intended for a 5 ampere, 100 volt device. An island-like P+ region 30 is centrally disposed on the upper surface of the N− epitaxial layer 28. The P+ and N+ doping levels can be about $1 \times 10^{19}$ to $1 \times 10^{20}$ impurity atoms per cubic centimeter in my device.

The lower N+ ring 22 forms a PN junction, identified as J1, with the P− body portion 24. The P− body portion 24 forms a second PN junction, identified as J2, with the middle N+ ring 26 and the N− epitaxial layer 28. The epitaxial layer 28 forms a third PN junction, identified as J3, with the island-like region 30. Junctions J1 and J2 comprise the NPN transistor 12. Junctions J2 and J3 comprise the PNP transistor 10.

Accordingly, it can be considered that the lower N+ ring 22 is an emitter region for the NPN transistor 12, while the P+ region 30 is the emitter region for the PNP transistor 10. The P− body portion 24 can be considered as being both the base region of the NPN transistor and the collector region of the PNP transistor. Analogously, both the middle N+ ring 26 and its contiguous N− epitaxial layer 28 can be considered as being both the collector region of the NPN transistor 12 and the base region of the PNP transistor 10.

The upper surface of the epitaxial layer 28 has a circumferential P-type ring 32 on its outer periphery, outwardly spaced from the P+ island 30. Accordingly, the P-type ring 32 forms a concentric ring around the P+ island region 30, with a portion 28a of the epitaxial layer 28 between them. An N+ circumferential ring 34 is nested wholly within the outer periphery of the P-type ring 32. It thus forms a third and upper N+ ring, that is disposed on the top step of the device structure. This top step is the outer edge of the upper surface of the epitaxial layer 28. A PN junction 36 separates the P-type ring 32 from the epitaxial layer 28. A PN junction 38 separates the upper N+ ring 34 from its surrounding P-type ring 32.

A 1,000–10,000 angstrom thick silicon dioxide film 40 of IGFET gate quality covers the top and sides of the epitaxial layer 28 and the silicon body 24. This silicon dioxide layer need not be uniform on the top and sides of the epitaxial layer 28 and the silicon body 24. On the sides of layer 28 and body 24 it can be thinner than on top of layer 28. By IGFET gate quality, I mean silicon dioxide film 40 is chemically pure and substantially pin-hole free, as is usually desired for a gate dielectric in an insulated gate field effect transistor. A first circumferential polycrystalline silicon electrode 42 is disposed on the middle step and on the contiguous riser portion, i.e. side wall, of the body 24 beneath it. Thus, it extends from the N+ lower ring 22 up to the N+ middle ring 26. A second circumferential polycrystalline silicon electrode 44 is disposed on the middle and top steps and on the interjacent riser portion, i.e. side wall, of the epitaxial layer 28 therebetween. Thus, it extends from the N+ middle ring 26 to the upper N+ ring 34. These polycrystalline silicon electrodes can be formed by a single polycrystalline silicon layer followed by a proper delineation process to define the electrodes.

A phosphosilicate glass coating 46 covers the dielectric coating 40 and the polycrystalline silicon electrodes 42 and 44. Windows in the dielectric coating 40 and the phosphosilicate glass coating 46 are provided so that a metal electrode 48, referred to herein as a cathode, can make contact with the N+ ring 22. Windows are also provided in the phosphosilicate glass coating 46 and in the dielectric coating 40 over the P+ island 30 and over its concentric upper N+ ring 34, so that a metal electrode 50 can selectively make contact with both of the P+ island and the upper N+ ring. In other words, upper N+ region 34 is electrically in parallel with the PNP emitter region 30 by means of the metal electrode 50. The metal electrode 50 is referred to herein as an anode. In operation, anode 50 is connected to a source of electrical potential that is positive with respect to the electrical potential applied to the cathode 48. In automotive applications, the cathode would be grounded together with the P− body 24.

A first N-channel IGFET is used to turn-on this thyristor. It is indicated by reference numeral 14 in FIG. 1. In FIG. 2, it comprises the lowermost N+ ring 22 as a source region, the middle N+ ring 26 as a drain region, and the surface adjacent portion 24a of P− body 24 between them as a channel region. The IGFET 16 used for turn-off of the device is also an N-channel IGFET. It is formed by the middle N+ ring 26 and the side wall portion of the epitaxial layer 28 as a source region, the upper N+ ring 34 as a drain region, and the surface adjacent portion 32a of P-type ring 32 between them as a channel region. Polycrystalline silicon electrode 42 forms a gate electrode for turn-on IGFET 14. It thus forms a turn-on control gate for my thyristor. Analogously, polycrystalline silicon electrode 44 forms a gate electrode for turn-off IGFET 16. It thus forms a turn-off control gate for my thyristor.

It should be noted that the middle portion 24b on the upper surface of silicon body 24 projects upwardly into the center of the middle circumferential N+ ring 26. Hence, ring 26 completely encircles portion 24b. It should also be noted that the middle N+ ring 26 has no electrical contact to it. It is allowed to electrically float in accordance with potentials applied to the cathode 48, anode 50 and the gate electrodes 42 and 44. It should also be noted that the resistance $R_{shunt}$, indicated by reference numeral 20 in FIG. 1, is an internal resistance in the silicon body region 24 extending from portion 24b to the cathode contact 48. As is previously known for thyristors turned on by means of an insulated control gate, the shunt resistance 20 is of a value related to the characteristics of the turn-on IGFET that produces turn-on of the thyristor at a predetermined control gate voltage. While shunt resistance 20 should be considered here, it is no more important to this invention than it is to the prior single insulated gate controlled thyristors.

Assuming the thyristor shown in the drawing is in a forward blocking state, with a gate potential applied to neither of IGFET 14 or 16, the thyristor is turned on when a positive potential is applied to control gate 42. This produces an N-type channel in body portion 24a beneath gate electrode 42 that interconnects the N+ regions 22 and 26. Electrons can then flow from the cathode 48 to the N+ region 26 and be finally collected by anode 50. This lowers the electrical potential on N+ ring 26 and N− epitaxial region 28, and forward biases the emitter-base PN junction J3 of the PNP transistor 10, tending to turn-on the PNP transistor 10. This action provides holes for injection into the base region 24 of the NPN transistor 12 across its emitter-base PN junction J1. Since the emitter-base PN junction J1 is already forward biased, the supply of hole current provides base drive to the NPN transistor, tending to turn it on.

The voltage drop across the shunt resistance 20 is sufficient to allow the forward bias of the NPN transistor 12 and emitter-base PN junction J1. The current gain alpha of each of the two transistors increases as current increases. When the sum of the two alphas exceeds one, regenerative switching to a low voltage, high current state will take place, as is known. Accordingly, for turn-on, my thyristor is similar to the prior single insulated gate thyristors previously referred to. Commercially available versions of these are referred to as COMFETs and as IGTs. I consider that turn-on operation and design principles are similar. For example, in such types of prior art devices, the shunt resistance 20 is of a value, as compared to the conduction characteristics of the turn-on IGFET 14 to forward bias the base-emitter junction of the NPN transistor 12. Since shunt resistance 20 serves a turn-on purpose in this invention similar to what it does in the prior COM-FET, the same prior considerations respecting its use should still be observed. This invention does not change them.

In any event, once regenerative switching starts, i.e. the NPN and PNP transistors are latched, current flow occurs in the manner previously described by conventional thyristor theory. In that circumstance, the positive voltage, i.e. turn-on voltage, need no longer be applied to the gate electrode 42 of the turn-on IGFET 14, as with some prior art devices. Accordingly, removing the positive voltage from the gate electrode 42 does not turn the thyristor off. Thus, as in a latched-on COMFET, conduction will continue until the anode-cathode voltage difference is no longer sufficient to provide injection across the emitter-base junction of the PNP and/or NPN transistors 10 and 12. In some prior devices, conduction can be stopped, i.e. before anode-cathode potential drops to a low value, by applying a negative potential to an appropriate gate electrode. On the other hand, one neither has to wait until the anode-cathode voltage drops nor has to apply a negative voltage in my thyristor. One can stop regenerative switching, i.e. turn off the thyristor, by applying a positive potential to the second gate electrode 44, even if the anode-cathode voltage has not dropped at all. Thus, a positive potential is used both to turn on and to turn off this embodiment of my invention.

Turn-off of this thyristor is obtained by means of the second IGFET 16. As previously mentioned, turn-off is produced by first turning off IGFET 14, if it was not previously turned off. This is accomplished, of course, by removing the positive potential that was previously applied to gate electrode 42, to turn on the thyristor. Turn-off of the thyristor can then be accomplished by turning on IGFET 16. IGFET 16 is turned on by applying a positive electrical potential to the gate electrode 44, of the turn-off IGFET 16 that is above a channel threshold value. This produces an N-type channel 32a along the surface of the P-type outer ring 32 beneath the gate electrode 44. The N-type channel provides a low resistance electrical path between the epitaxial layer 28 and the upper N+ ring 34, which is in direct contact with anode 50. Three effects are produced. First, it should be recalled that epitaxial layer 28 serves not only as the collector for the NPN transistor 12, but also as the base region for the PNP transistor 10. Hence, when the voltage on gate 44 is above threshold value, electrons have a parallel path around the base region of the PNP transistor 10 directly to the anode. Secondly, this low current path is electrically in parallel with the base-emitter junction J3 of the PNP transistor 10. Accordingly, the forward bias of the PNP transistor emitter-base junction J3 will be reduced, reducing hole injection across this junction. The attendant hole current flow through the PNP transistor 10 is thus reduced, reducing base drive to NPN transistor 12 that tends to turn it off.

It should be recognized that turn-off gate 44 does not just extend to the N− epitaxial layer 28. It extends completely across the edge of N− epitaxial layer onto the middle N+ ring 26. Thus, the N− channel produced by a positive potential on gate 44 provides a low electrical resistance path between upper N+ ring 34 and middle N+ ring 26. Thirdly, it should be recalled that (a) the upper N+ ring 34 is shorted to anode 50 and (b) the middle N+ ring 26 electrically floats. When the turn-off IGFET 16 is conducting, the electrical potential of the middle N+ ring 26 approaches that of anode 50. The resulting strong reverse bias on the junction J2 produces a space charge region that inhibits current flow through the center portion 24b of the silicon body 24.

More specifically, when the middle N+ ring 26 is at about anode potential, it acts as a junction field effect transistor gate in pinching off the path for hole flow from anode 50 through the P− region to cathode 48. Thus, conductivity modulation of N− region 28 rapidly ceases, to reestablish the nonregenerative condition. Accordingly, I show the pinch resistor as the junction field effect transistor (JFET) 18, in which its source and drain would be the top and bottom of P− region 24b, respectively. In this connection, it should be noted that the principal hole flow would occur from the centrally disposed P+ island-like region 30 which is aligned over the central P− portion 24b. Since the epitaxial layer is only lightly doped, the predominant hole flow will occur from the P+ island 30 directly to the central P− portion 24b aligned beneath it, rather than to the outlying portions of the P− body 24 beneath the middle N+ ring 26. When the positive potential is applied to the turn-off gate electrode 44, the resulting positive field on the side wall of epitaxial layer 28 tends to confine hole flow into the middle of the epitaxial layer 28.

In order to throttle the anode-to-cathode hole current flow in accordance with this invention, it is thus desirable that the emitter 30 of the PNP transistor be centrally located and that the P-type body 24 and the N-type epitaxial layer 28 both be lightly doped. On the other hand, such doping is normally inherent to a thyristor. Accordingly, the same type of doping relationships and levels can be used in this invention that would ordinarily be used in any other thyristor. It should be observed, of course, that the middle N+ ring 26 should have an inner diameter that is small enough to completely pinch off hole current flow through the central P− portion 24b, at the field effect produced on the portions 24b at the voltage and current flow at which turn-off is desired. That field effect would depend upon the voltage applied at anode 50, the conductivity of the turn-off IGFET 16, the conductivity of N+ ring 26, current flow from anode-to-cathode, etc. The inner diameter of my thyristor is thus variable, depending on a plurality of factors. However, for automotive applications, I prefer that the inner diameter of N+ ring 26 be about 4–10 micrometers. This spacing is based on achieving the blocking capability of about 80 volts or higher on the anode.

It should also be mentioned that it is most desirable that the inner diameter of the middle N+ region 26 be larger than the outer diameter of the P+ island region 30, at least by about 10–50 percent. This requirement can be eliminated or made less stringent if a mesh-like N+ region 26 is used, such as shown in connection with FIGS. 4 and 5.

Analogously, I prefer that the middle N+ region not extend beneath the epitaxial layer 28 significantly more than the most significant electron depletion effect produced by the positive potential applied to the turn-off gate electrode 44, in order to further prevent the middle N+ region 26 from siphoning off any significant proportion of the holes injected into the epitaxial region 28 from the PNP emitter region 30. In general I would think that the middle N+ region 26 should not extend beneath the epitaxial region 28 more than about 3–15 micrometers. However, experimental results are needed to confirm this.

It should also be recognized that one can ordinarily make a thyristor conductive, i.e. start regenerative switching, by simply increasing the anode-cathode applied voltages. In my thyristor, such an effect can also occur. On the other hand, the pinch effect of the middle N+ ring 26 shields the anode from the cathode. Consequently, my thyristor can withstand higher anode-cathode voltages if one maintains a positive voltage applied to the turn-off gate electrode 44. In fact, I may prefer to always keep a voltage on gate 44 unless I want the thyristor turned on. For example, a COMFET can turn-on simply because of a rapid voltage rise on the anode or if the temperature significantly increases. Such an effect can occur in my device too. However, I can protect against it, by leaving a positive voltage on gate electrode 44.

Once my thyristor goes into the regenerative switching, i.e. latched mode, conduction characteristics of the device become independent of the voltage applied to the turn-on gate electrode 42. Accordingly, the voltage applied to the turn-on gate electrode 42 need not be maintained once the device is latched.

Figure 6:
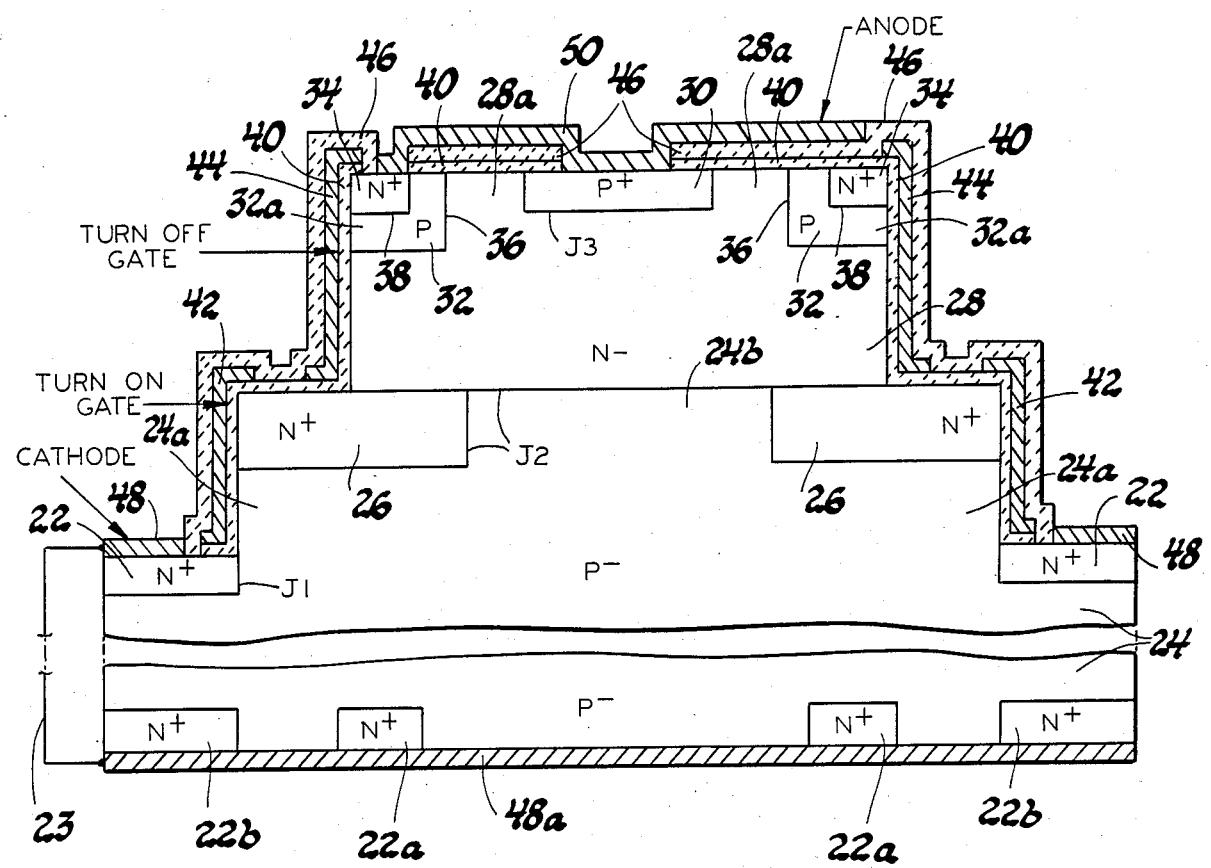
FIG. 6 shows a cross-sectional view of still another modification of the thyristor shown in FIGS. 2 and 3.

It should also be recognized that N+ ring 22 could have inner edge conformations to increase edge length, or be formed on the bottom side of P− body 24, as N+ rings 22a or 22b. Alternatively such N+ regions 22a and 22b could both be used in addition to N+ region 22, to increase the electron injection. Such a structure is shown in FIG. 6 of the drawing. These alternative or additional regions 22a and 22b should be laterally outside the central region when viewed from above, i.e. not directly below region 30, to prevent unintentional latching during turn-off, high temperature operation, or rapidly rising anode voltages.

An electrical contact could be made to each of N+ bottom rings 22a and 22b, and these contacts placed in low resistance electrical communication with the cathode 22 by means of an external jumper wire 23. However, such a construction is not shown. The reason for not showing it is that, in the uses I now contemplate, my device would more frequently be used only in the forward blocking mode. In such instance, I prefer to have the backside contact (i.e. bottom metallization) 48a extend entirely across the bottom surface of the device as shown in FIG. 6. This enhances higher temperature forward blocking characteristics and reduces the forward voltage drop of the device when it is turned on. In such a backside contact, N+ bottom rings 22a and 22b are electrically shorted to the P− body 24. This presents no difficulties when P− body 24 is thick, as in the case contemplated here. With P− body 24 being thick, its internal resistance is considerably higher than $R_{shunt}20$ between P− body center portion 24b and the lower N+ ring 22. Accordingly, $R_{shunt}20$ is still the controlling resistance for device turn-on, even though backside contact 48a is in low resistance electrical communication with cathode 48, such as by means of the external jumper wire 23. It should also be mentioned that contacts 48 and 48a and jumper wire 23 could even be integral parts of but one metallization coating, depending on the layout (i.e. geometry) of the device.

Figure 3:
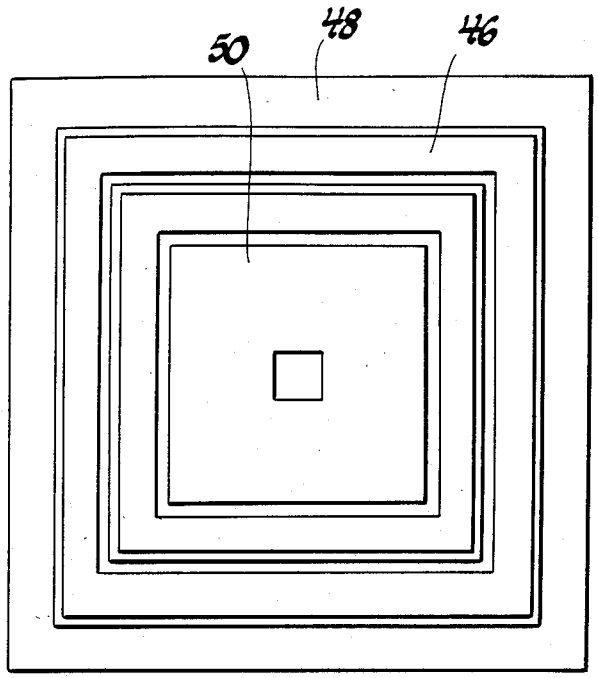
FIG. 3 shows a plan view along the line 3—3 of FIG. 2.
Figure 4:
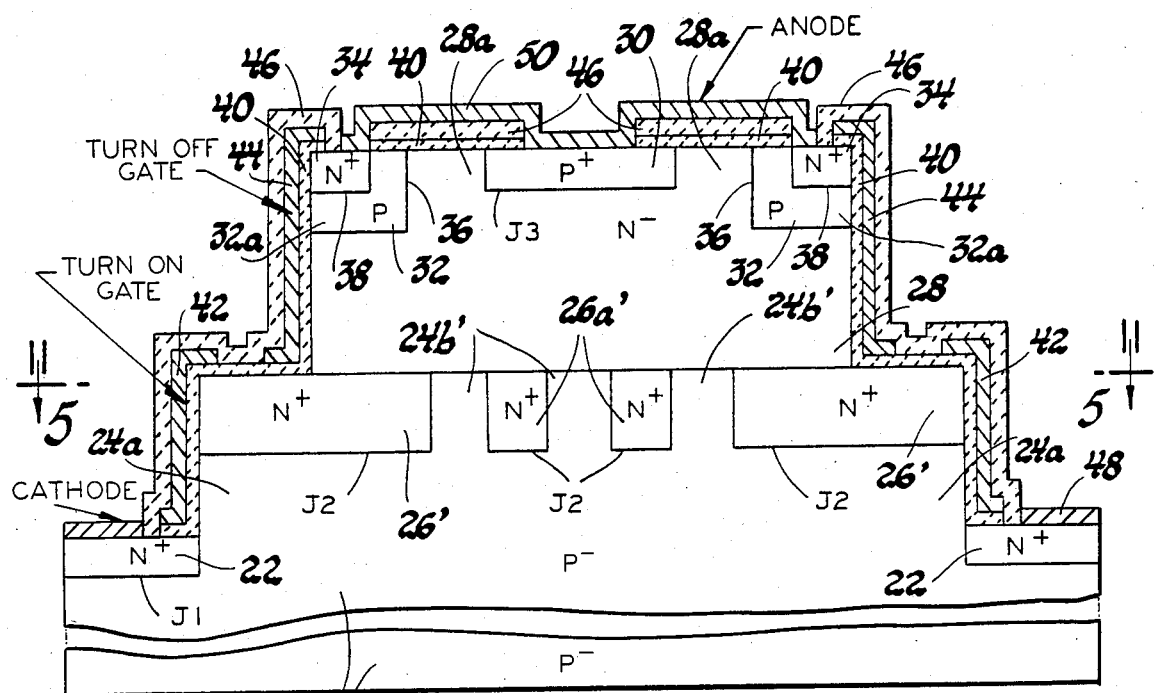
FIG. 4 shows a cross-sectional view of a modification of the thyristor shown in FIGS. 2 and 3.
Figure 5:
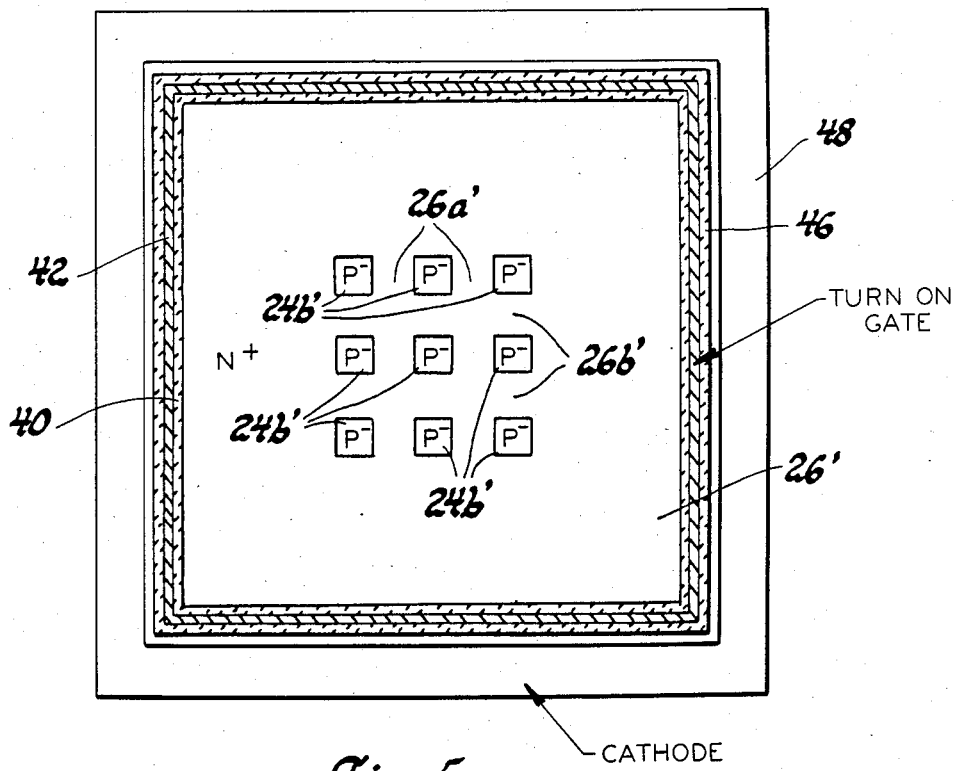
FIG. 5 shows a view along the line 5—5 of FIG. 4.

Analogously, it should also be recognized that a different pattern can be used to form the middle N+ ring 26. One such different pattern is illustrated in FIGS. 4 and 5. In fact, the only difference between the device shown in FIGS. 4 and 5 and the device shown in FIGS. 2 and 3 resides in the pattern of the middle N+ ring 26'. In FIGS. 2 and 3 the middle N+ ring 26 is a simple ring.

In the device shown in FIGS. 4 and 5, the middle N+ ring 26' also has a lattice arrangement in its center. This lattice is formed by integral column extensions 26a' and integral row extensions 26b'. The intersecting rows and columns 26a' and 26b' leave a plurality of discrete portions 24b' of the body 24' therebetween. Each of these multiple discrete portions 24b' can form an individual pinch-resistance region in the resultant structure. Accordingly, one can make a very large area device that can have a considerable power rating. Each individual pinch-resistance region 24b' would then preferably have a width of about 4–10 micrometers, as was described in connection with portion 24b of FIGS. 2–3.

It should also be recognized that the N+ middle layer 26' in FIGS. 4 and 5 need not be a lattice. For example, one may choose to only use rows 26a' spaced 4–10 micrometers apart or columns 26b' spaced 4–10 micrometers apart. It should also be recognized that the additional conformations on the inner periphery of the middle N+ layer 26 provides additional emitter edge, which enhances electron injection efficiency for the NPN transistor. Accordingly, the unique configuration of the middle N+ layer not only enhances turn-off characteristics of the device but also should make it turn-on faster.

Analogously, N+ rings 22 and 26 could be formed on the same tread. They do not have to be on different steps. In such instance, for example, middle N+ ring 26 would be on the same vertical lever as lower N+ ring 22, which could be its own level as shown in the drawing on that of lower N+ ring 22. In any event, lower N+ ring 22 would be a concentric ring spaced outwardly from middle N+ ring 26 an appropriate distance to maintain $R_{shunt}$ at the desired value. Accordingly, one would only etch one groove, not two, to make the device.

I wish to also mention that my device has been shown as a vertical structure. On the other hand, it is expected that one could make an equivalent device in a horizontal, i.e. lateral, structure. The lateral structure could be quite similar to the left half of what is shown vertically in cross-section in FIG. 2. In such instance one end of a semiconductive film would be of one conductivity type, the other end would be of the opposite conductivity type with anode and cathode disposed at these opposite ends. The principal distinguishing feature would be that there would be an electrically floating middle N+ region connected to turn-on and turn-off IGFETs, to provide a pinch resistance in accordance with this invention.

Still further, I wish to mention that I electrically short upper N+ ring 34 to the anode 50 only to provide a convenient and simple source of positive potential for the drain region of the turn-off IGFET 16. One can alternatively provide a separate electrical contact (not shown) to upper N+ ring 34 and connect it to a separate source of positive potential (also not shown), which I may choose to refer to as $V_{DD}$. If anode voltage is approximately 80 volts, one can use a potential of only about 8–10 volts on $V_{DD}$. In such event, one need only use a voltage of about 4 or 5 volts on the gate electrode 44 of the turn-off IGFET 16 in order to turn off the entire thyristor. On the other hand, if the upper N+ ring 34 is electrically shorted to the anode 50 a considerably higher voltage may have to be applied to the gate electrode 44 in order to raise the voltage on N+ region 26 sufficiently to get a rapid turn-off. Use of such a high control voltage may not be desirable in some applications. Accordingly, it may be that one would prefer to have a separate electrical contact for the N+ ring 34.

This invention involves an electrical pinch effect produced by an electrically floating N+ region 26. The turn-off IGFET 16 is a means for applying a positive voltage to the N+ region 26. Other IGFET structures and other means may be desired to bring up the desired positive potential for turn-off.

Still further it should be recognized that the N+ region 26 could be of any configuration which provides a pinch effect normal to the direction of current carrier flow in the device. This is irrespective of whether the device can be considered as a vertical cylindrical device or as a film (i.e. lateral) device. If it is to be made as a film device, one can provide an N+ region extending from one edge of the film almost across to the other edge, or two opposed regions extending toward one another from opposite edges. The edges can be the top and bottom of the film, or its sides. In any event, one would leave a small cross-sectional portion of the film forming the PNP collector region that would have a maximum dimension no greater than that which can be pinched off by the voltage being applied to the N+ region, or regions, 26. In other words, the portion of the PNP transistor collector region normal to the direction of current carrier flow would not have a maximum dimension larger than that which could be substantially depleted of carriers by the positive voltage applied to the contiguous N+ region 26. If a higher power device is desired, one can simply use a multiplicity of such pinch regions, such as is inherent to the lattice-type structure shown in connection with FIGS. 4 and 5.

The PN junctions J1-J3 are hereinbefore described as diffused junctions having particular doping levels. Other doping techniques can be used, as for example, ion implantation. Analogously, other doping levels can be used, depending on the electrical properties desired in the resultant device. Still further, the PN junctions J1 and J3 presumably might even be Schottky barriers, since they do not have to withstand high voltages. Schottky barriers for J1 and J3 should provide a lower forward voltage drop than diffused PN junctions, and for that reason may even be preferred.

The foregoing examples of my invention contemplate a thyristor in which positive voltages are used both to turn the device on and to turn it off. As indicated, the JFET produces a pinch resistance effect in the P− region 24b by the surrounding middle N+ ring 26. Turn-off of the device is produced by applying a positive voltage to the turn-off gate 44 of an N-channel IGFET that is formed between the middle N+ ring 26 and the upper N+ ring 34. The positive voltage on gate electrode 44 inverts a surface portion 32a of the P-type ring 32, so that the middle N+ ring 26 is brought into low resistance communication with the anode potential applied to the upper N+ ring 34. The anode potential reverse biases PN junction J2 to produce a pinch effect on the P− body portion 24b which it surrounds.

Figure 7:
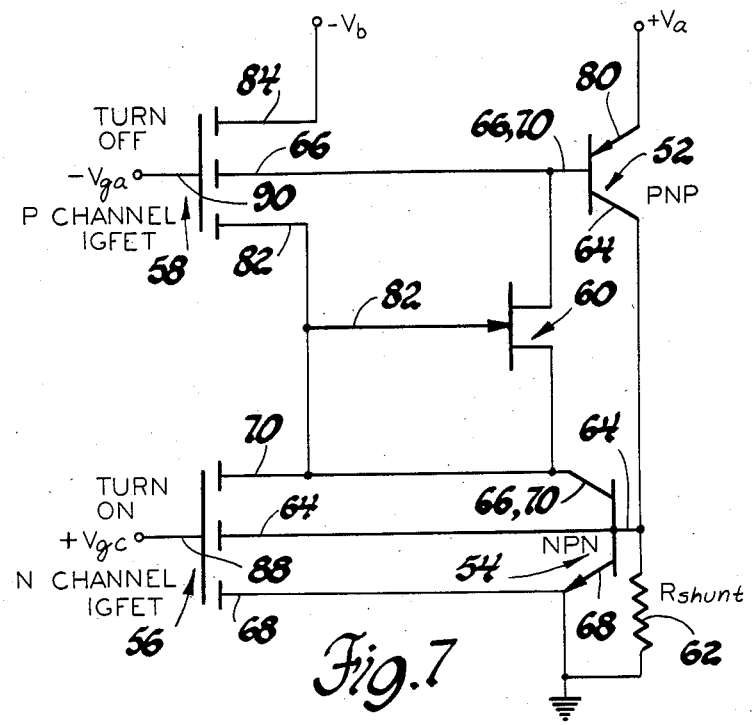
FIG. 7 shows an electrical schematic of an alternative embodiment of this invention.
Figure 8:
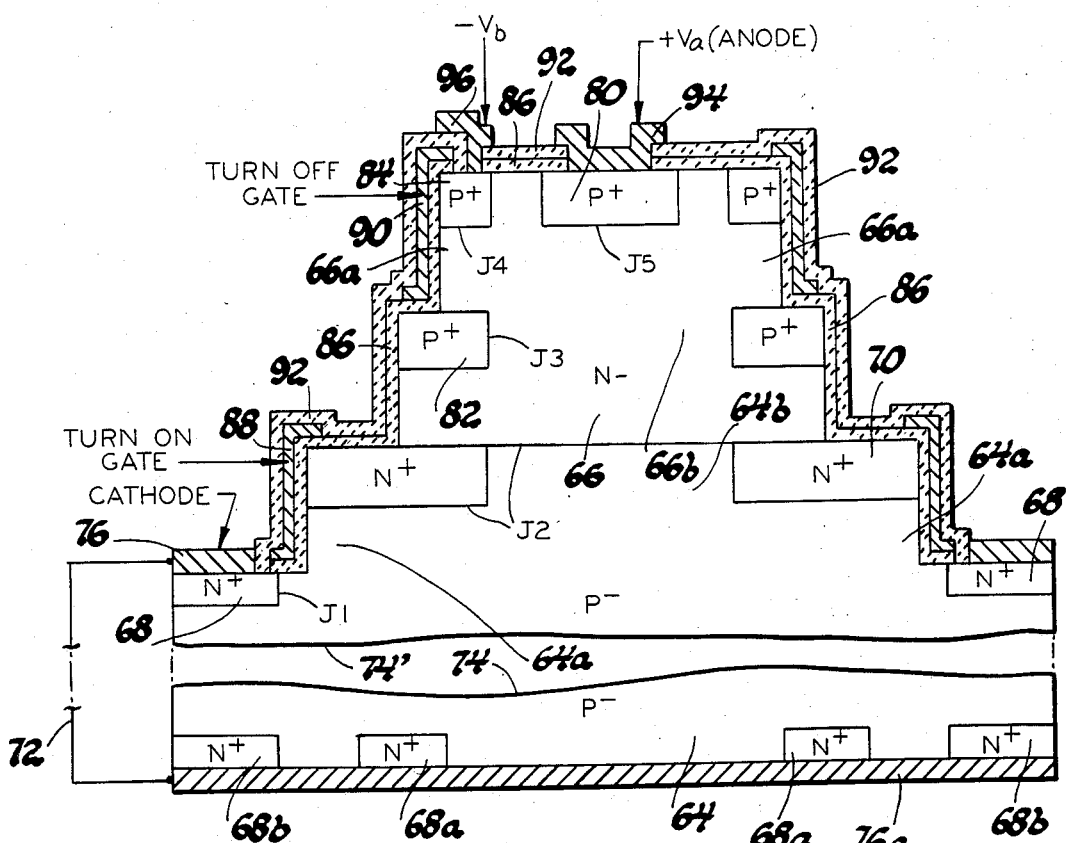
FIG. 8 shows a cross-sectional view of a thyristor represented by the electrical schematic shown in FIG. 6.

The embodiment of the invention illustrated in FIGS. 7 and 8 uses a P+ ring 82, a P-channel, IGFET 58, and a negative gate potential to turn the thyristor off. By negative, I mean negative with respect to the thyristor cathode. This embodiment of my device is schematically shown in FIG. 7. It can be considered as including a PNP transistor 52, an NPN transistor 54, an N-channel insulated gate field effect transistor (IGFET) 56, and a P-channel insulated gate field effect transistor (IGFET) 58. It also includes a pinch resistance which I prefer to refer to as a junction field effect transistor (JFET) 60. FIG. 7 also shows a resistance 62, that is identified as $R_{shunt}$. Resistance 62 is an internal resistance, between the emitter and base of the NPN transistor, that is used in the normal and accepted way to produce device turn-on when IGFET 56 is activated.

Reference is now made to FIG. 8 which shows a specific embodiment of the thyristor electrically represented by FIG. 7. As with the earlier figures of the drawing, this embodiment is not drawn to scale, to make illustration easier. The structure shown in FIG. 8 is a concentric type of device, as illustrated in the earlier figures of the drawing. Hence, it is symmetrical about its vertical center line.

More specifically, FIG. 8 shows a rectangular P− silicon body member 64 having a reduced cross-section zone on its side edge that forms a step. An N− layer 66, of smaller cross-section than P− body 64, is disposed on top of body 64, forming a second step on the side of the device. The N− layer has a reduced cross-section zone, that forms a third step on the side of the device. The top edge of N− layer 66 forms a fourth step on the device. Accordingly, the device shown in FIG. 8 is a four-step device, rather than a three-step device, such as is illustrated in the earlier figures of the drawing.

The lower portion of the FIG. 8 thyristor is quite similar to the lower portion of the devices illustrated in earlier figures of the drawing. For example, the tread-like portion of the lowest step on the P− silicon body 64 has a ring-like N+ region 68 on its circumference. The tread portion of the second step has an upper ring-like N+ region 70. The lower N+ ring 68 can have inner edge conformations to increase edge length. It can also be formed on the bottom side of the p− body 64, as N+ concentric bottom rings 68a or 68b. Alternatively, N+ bottom regions 68a and 68b could both be used in combination with the N+ ring 68 to increase the electron injection of the device. In such instance, the same electrical potential would be applied to the lower N+ ring 68 and the bottom N+ rings 68a and 68b by means of a common contact, a conductor communicating their contacts, etc. N+ bottom rings 68a and 68b have an electrical contact 76a across the entire bottom, including exposed portion of P− body 64, for the same reasons discussed in connection with FIG. 6. As also similar to FIG. 6, I show contact 76a connected to contact 76 by means of a discrete conductor 72. This is because the thickness of the P− body 64 normally is so great, as indicated by the "break" lines 74 and 74' in FIG. 8, that a common electrode contact on regions 68, 68a and 68b is not practical. However, in some other device geometries it might be desired. I consider the contact 76 on the upper surface of the device, not bottom contact 76a, as the principal electrode and have therefore designated it as the cathode in FIG. 8.

As with N+ ring 26 in the prior embodiments of the invention, the upper N+ ring 70 can be considered as being disposed on the periphery of the upper surface of the P− body of my device. Hence, it encircles a P surface portion 64b of body 64 and extends to the outer edge of that surface. A spacing between the lower N+ ring 68 and the upper N+ ring 70 should be maintained to insure that there is adequate shunt resistance 62 between junctions J2 and J1. Spacings, doping levels, thicknesses, widths and the like, for the body portions and regions mentioned would be the same as in the preceding embodiments of the invention.

Also as illustrated in the preceding embodiments of the invention, there is an N− epitaxial layer 66 of the order of about 500–1,000 micrometers wide and about 20–500 micrometers thick disposed on the upper surface of the P− body 64, over its center portion 64b and overlapping onto only the inner circumferential portion of the upper N+ ring 70. The N− layer 66 could have a doping level of about $1 \times 10^{14}$ or $1 \times 10^{15}$ impurity atoms per cubic centimeter. The preferred width of layer 66 depends on the current capability desired for the device and, as a practical matter, the bonding wire diameter that is to be used and its anode. The preferred thickness of layer 66 depends upon the voltage breakdown characteristic desired. The range in width and thickness given is intended for a 5 ampere, 100 volt device. As in the prior embodiments, an island-like P+ region 80 is centrally disposed on the upper surface of the N− epitaxial layer 66. The P+ and N+ doping levels in this device can be about $1 \times 10^{19}$ to $1 \times 10^{20}$ impurity atoms per cubic centimeter as in the preceding embodiments of the invention.

Differing now from the prior embodiments of the invention, the N− layer 66 has a reduced cross-section zone that forms a third step on the side edge of the device. The tread portion of this third step has a ring-like P+ region 82 on its circumference. The upper surface of the N− layer 66 has a circumferential P+ ring 84 on its outer edge, outwardly spaced from the P+ island 80. The P+ ring 84 therefore forms the fourth, or top, step in this device structure. A PN junction J3 separates the lower P+ ring 82 from the N− epitaxial layer 66. PN junction J4 separates the upper P+ ring 84 from the N− epitaxial layer 66. PN junction J5 separates P+ island 80 from the N− epitaxial layer 66.

A 1,000–10,000 angstrom thick silicon dioxide film 86 of IGFET gate quality covers the top and sides of the epitaxial layer 66 and the silicon body 64. This silicon dioxide layer need not be uniform on the top and sides of the epitaxial layer 66 and the silicon body 64. On the sides of the epitaxial layer 66 and the body 64 it can be thicker on top of the epitaxial layer 66 than on its sides, where it is of a thickness less than about 1,500 angstroms. A first circumferential polycrystalline silicon electrode 88 is disposed on the first and second steps and on the interjacent riser portion, i.e. side wall, of the body 64 therebetween. Thus, it extends from the N+ lower ring 68 up to the N+ upper ring 70. A second circumferential polycrystalline silicon electrode 90 is disposed on the third and top steps and on the interjacent riser portion, i.e. side wall, of the epitaxial layer 66 therebetween. Thus, it extends from the P+ lower ring 82 to the P+ upper ring 84. These polycrystalline silicon electrodes can be formed as a single polycrystalline silicon layer followed by a proper delineation process to define them as separate electrodes. It should also be mentioned that electrode 90 extends between two P+ regions, not between two N+ regions, as in the earlier embodiments of this invention. P+ rings 82 and 84 thus form a P-channel IGFET in combination with the gate electrode 90.

A phosphosilicate glass coating 92 covers the dielectric coating 86 and the polycrystalline silicon gate electrodes 88 and 90. Windows in the phosphosilicate glass coating 92 and in the dielectric coating 86 are provided so that the metal electrode 76, referred to herein as a cathode, can make contact with the lower N+ ring 68. Windows are also provided in the phosphosilicate glass coating 92 and in the dielectric coating 86 over the P+ island region 80 and over the upper P+ ring 84. A metal electrode 94 is disposed in the window over the P+ island region 80. I refer to electrode 94 as an anode. Another metal electrode 96 is disposed in the window over the P+ ring 84. The metal electrode 96 is not shown as a ring electrode. However, it could be, if so desired.

Also differing from the prior embodiments, the FIGS. 7 and 8 embodiments require a source of negative electrical potential, with respect to the potential applied to the cathode. As can be seen a potential that is positive with respect to the cathode is applied to the metal electrode 94. A potential negative with respect to the cathode potential is applied to the metal electrode 96. By way of example, the cathode might be in low resistance electrical connection with an electrode in one of the middle cells of a group of serially connected voltaic cells forming a battery. Electrodes 94 and 96 would be respectively connected to outermost electrodes of the cell series. One might consider such a series of cells as a three terminal battery.

No electrical contacts are shown to the gate electrodes 88 and 90 because in most instances the electrical contacts to such electrodes are formed on a surface area of body 64 at an area removed from the part of the device shown in the drawing. However, it is to be understood that appropriate means are provided to apply positive and negative potentials to the gate electrodes 88 and 90, respectively. Gate electrodes 88 and 90 are respectively identified as a turn-on gate and a turn-off gate in FIG. 8. If needed, windows could be provided in the overlying phosphosilicate coating 92 to make electrical contact to these electrodes.

As with the preceding embodiment of this invention, the lower N+ ring 68 forms a PN junction, identified as J1, with the P− body portion 64. The P− body portion 64 forms a second PN junction, identified as J2, with the upper N+ ring 70 and N− epitaxial layer 66. The epitaxial layer 66 forms a third PN junction, identified as J3, with the lower P+ ring 82. The N− epitaxial layer forms another PN junction, identified as J4, with the upper P+ ring 84. It forms still another PN junction, identified as J5, with the P+ island-like region 80.

Junctions J1 and J2 comprise the NPN transistor 54. Junctions J2 and J5 comprise the PNP transistor 52. Accordingly, it can be considered that the lower N+ ring 68 is an emitter region for the NPN transistor 54, while the P+ island-like region 80 is the emitter region for the PNP transistor 52. The P− body portion 64 can be considered as being both the base region of the NPN transistor 54 and the collector region of the PNP transistor. Analogously, the upper N+ ring 70 and its contiguous N− epitaxial layer 66 can be considered as being both the collector region NPN transistor 54 and the base region of the NPN transistor 52.

An N-channel IGFET is used to turn on this embodiment of my thyristor. It is indicated by reference numeral 56. It comprises the lower N+ ring 68 as a source region, the middle N+ ring 70 as a drain region, and the interjacent surface portion 64a of P− body 64 as a channel region. As previously mentioned, the IGFET 58 used to turn off this embodiment of my device is a P-channel IGFET. It is formed by the lower P+ ring 82 as a source region, the upper P+ ring 84 as a drain region, and the interjacent surface portion 66a of N− epitaxial layer 66 as a channel region. Polycrystalline silicon electrode 88 forms a gate electrode for turn-on of N-channel IGFET 56. It thus forms a turn-on control gate for my thyristor. Analogously, polycrystalline silicon electrode 90 forms a gate electrode for turn-off of P-channel IGFET 58. It thus forms a turn-off control gate for my thyristor.

It should be noted that a middle portion 66b of the N− epitaxial layer 66 is completely surrounded by the P+ lower ring 82. In other words, there is a portion of the base region of the PNP transistor, along the direction of current flow, that is completely encircled by the P+ ring 82. It should also be noted that the P+ ring 82 has no electrical contact to it. It is allowed to electrically float in accordance with the potentials applied to the anode electrode 94, the cathode 76, and the gate electrodes 88 and 90.

It should also be noted that the resistance $R_{shunt}$ indicated by reference numeral 62 in FIG. 7, is an internal resistance in the silicon body region 64, extending from portion 64b to the cathode contact 76. As is previously known for thyristors turned on by means of an insulated control gate, the shunt resistance 62 is of a value related to the characteristics of the turn-on IGFET that produces turn-on of the thyristor at a predetermined controlled gate voltage. While shunt resistance 62 should be considered here, it is of no more importance to this invention than it is to the prior single insulated gate controlled thyristors.

Assuming the thyristor embodiment shown in connection with FIGS. 7 and 8 is in a forward blocking state, with gate potential applied to neither IGFET 56 or 58, it is turned on when a positive voltage $+V_{gc}$ is applied to the turn-on gate, reference numeral 88. This produces an N-type channel 64a in the portion of body 64 beneath gate electrode 88. The N-type channel provides a low resistance interconnection between N+ rings 68 and 70. Electrons can then readily flow from the cathode 76 to the N+ ring 70, for eventual collection by the anode 94. This forward biases the emitter-base PN junction J5 of the PNP transistor 52, tending to turn-on the PN transistor 52. This action provides holes for injection into the base region 64 of the NPN transistor 54 across its emitter-base PN junction J1. Since the emitter-base PN junction J1 is already forward biased, the supply of hole current provides base drive to the NPN transistor 54, tending to turn it on. The voltage drop across the shunt resistance 62 is sufficient to allow the forward bias of the NPN transistor 54 and the emitter-base PN junction J1. The current gain alpha of each of the two transistors increases as current increases. When the sum of the two alphas exceeds one, regenerative switching to a low voltage, high current state will take place, as in the preceding emobodiment of this invention. Accordingly, for turn-on, this thyristor is similar to the prior single insulated gate thyristor and to the prior embodiment invention described herein. Once regenerative switching starts, i.e. the NPN and the PNP transistors are latched, current flow occurs in the manner previously described. In each instance the positive voltage $+V_{gc}$ need not still be applied to make the device stay "on". I usually prefer to leave the $+V_{gc}$ applied until I am ready to turn the device off. Then I remove it to make the device ready for turn-off. One can stop the regenerative switching; i.e. turn off the thyristor, in this embodiment of the invention by applying a negative voltage $-V_b$ to the upper electrode 96 and a negative voltage $-V_{ga}$ to the turn-off gate, designated by reference numeral 90. Turn-off is achieved even if the anode-cathode voltage has not dropped at all.

In turning off this embodiment of the invention, a negative potential $-V_{ga}$ is applied to turn-off gate 90. However, it should be understood that a negative potential $-V_b$ is also being applied. In fact, $-V_b$ can be continuously applied, whether the device is on or off. As previously indicated, this produces a P-type channel 66a along the surface of the N− epitaxial layer 66 beneath turn-off gate 90. The P-type channel provides a low resistance electrical path between the two P+ rings 82 and 84, which brings the P+ ring 84 close to the negative potential $-V_b$ that is applied to electrode 96. When the lower P+ ring 82 is at a negative potential approaching $-V_b$, it acts as a junction field effect gate in pinching off the path for electron flow from the cathode 76 to the anode 94. The effect is analogous to the effect produced by N+ ring 26 in the preceding embodiment of this invention. It differs, however, in that this embodiment of the invention does not throttle the flow of holes through body portion 64b. Instead, this embodiment of the invention throttles the flow of electrons through the epitaxial layer portion 66b.

In other words, electron flow through the base 66, 70 of the PNP transistor 52 is restricted. It will be recalled that in the preceding embodiments of the invention hole flow through the collector of the same transistor was restricted. Restricting electron flow to anode 94 breaks the latch-up path in the device. Thus, conductivity modulation of the N region 66 rapidly ceases, which turns the device off, i.e. reestablishes the nonregenerative condition characteristic of the normally forward blocking state. I show the pinch resistance as a junction field effect transistor (JFET) 60 in which its source and drain would be bottom and top of the N− epitaxial layer portion 66b, respectively.

As in the prior embodiment of the invention, principal current flow would occur from the centrally disposed P+ island region 80 which is aligned over the central N− region 66b and P− region 64b. Since these regions are only lightly doped, the predominant hole and electron flow will occur from the P+ island 80 directly to these central portions aligned beneath it, rather than to the outlying portions beneath the upper N+ ring 70. When the negative potential is applied to the turn-off gate 90, the resulting circumferential negative field on the side wall of the epitaxial layer 66 tends to confine electron flow into the middle 66b of the epitaxial layers, precisely where one wants it to be, to provide a more effective pinch off.

Accordingly, in order to best throttle the anode-to-cathode electron current flow in accordance with this invention, it is desirable that the emitter 80 of the PNP transistor be centrally located and that the P-type body 64 and the N-type epitaxial layer 66 both be lightly doped. On the other hand, such doping is normally inherent to a thyristor. Accordingly, the same type of doping relationships and levels can be used in this embodiment of the invention that would ordinarily be used in any other thyristor.

As with the middle N+ ring 26 in the preceding embodiments of the invention, the lower P+ ring in this embodiment of the invention should have an inner diameter that is small enough to completely pinch off current flow through the surrounded region. In this case, it is electron flow through the central N− portion 66b. It should be remembered that this diameter is related to the voltage $-V_b$. The field effect, and therefore the voltage $-V_b$ needed, would also depend upon the voltage $+V_a$ applied at the anode 94, the conductivity of the turn-off IGFET 58, the conductivity of the P+ ring 82, current flow from anode-to-cathode, etc. The inner diameter of the P+ ring 82 can thus be varied, depending on a plurality of factors. However, for automotive applications I prefer that the inner diameter of the P+ ring 82 be about 4–10 micrometers. This basing is based on achieving the blocking capability of about 80 volts or higher on the anode.

Like the preceding embodiments of the invention, it is most desirable that the inner diameter of the lower P+ ring 82 be larger than the outer diameter of the P+ island region 80 by at least about 10–50 percent. This requirement can be eliminated or made less stringent if a lattice-like or mesh-like P+ region 82 is used instead of a simple ring, as mentioned in connection with the N+ region 26 in the earlier embodiments of this invention. In such a structure, the N-type material in each opening of the lattice or mesh is the functional equivalent of epitaxial layer portion 66b. It should also be mentioned that an equivalent device could be made in a horizontal, i.e. lateral, structure along the lines described for the preceding embodiments of the invention. Other variations can be made to this embodiment of the invention, along the lines of those hereinbefore described in connected with the preceding embodiments of the invention.

A device made in accordance with this invention offers distinct advantages in control capabilities. On the other hand, it appears to be subject to breakover at decreasing voltages with increasing temperatures. Accordingly, when it is not desired that the device be on, I prefer to keep it off by applying an appropriate voltage to its turn-off gate, i.e. gate 44 in FIGS. 2 and 6 and gate 90 in FIG. 8. It is also desirable to operate such a device at lower temperatures, as for example, below about 125°, to avoid having it inadvertently turn on if no turn-off gate voltage happens to be applied.

Still further, it should be understood that the single devices shown in the drawing are not necessarily used that way. A plurality of such devices can be formed on a single semiconductive body, such as a chip, to provide increased current handling capabilities.

The embodiments of the invention in which an exclusive property or privilege is claimed are defined as follows:

1. A gate-controlled thyristor that not only has an IGFET for turn-on but also has an IGFET and a variable resistance effect for turn-off, the thyristor comprising:

a semiconductor body containing integrated bipolar PNP and NPN transistors that form a thyristor;

the PNP transistor base region having a portion overlapped, in a direction parallel to the direction of electron current flow in the PNP transistor base region, by a region of opposite conductivity type semiconductive material that is not contiguous of the PNP transistor collector or emitter regions, for producing a PN junction space charge region effect that restricts electron flow through the PNP transistor base region;

an insulated gate electrode on said body, extending from emitter to collector regions of the NPN transistor, so as to form an integral enhancement type n-channel IGFET electrically in parallel with the NPN transistor emitter and collector regions;

an electrode on the PNP transistor emitter region, for applying an electrical potential thereto;

an electrode on the NPN transistor emitter region, for applying a second electrical potential thereto that is lower than the electrical potential applied to the PNP transistor emitter region; and means for applying a third electrical potential, that is lower than the electrical potential applied to the NPN transistor emitter region, to the opposite conductivity type region in the PNP transistor base region, effective to produce a space charge region in the overlapped portion of the PNP transistor base region that will inhibit electron current flow therethrough;

whereby, after the aforesaid electrode potentials are applied to said emitter region electrodes, an electrical potential that is higher than the NPN transistor emitter potential can be applied to the gate electrode of the IGFET to turn on the thyristor, and thereafter the third electrical potential can be applied to the opposite conductivity type region of the PNP transistor base region to turn off the thyristor.

2. A gate-controlled thyristor that not only has an IGFET for turn-on but also an IGFET and a space charge region effect for turn-off, the thyristor comprising:

a semiconductor body containing integrated bipolar PNP and NPN transistors that form a thyristor;

the base region of one of the transistors having a portion overlapped, in a direction parallel to the direction of current flow in that base region, by a region of opposite conductivity type that is not contiguous the one transistor emitter or collector regions to produce a PN junction that separates said one transistor base and opposite conductivity type regions and, if reversely biased, can inhibit majority carrier current flow through the base region of said one transistor;

means for applying an electrical potential to the opposite conductivity type region for reversely biasing the PN junction;

an insulated gate electrode on said body, extending from emitter to collector regions of the other transistor, so as to form an integral IGFET electrically in parallel with the other transistor emitter and collector regions that is non-conducting unless a gate potential is applied to it that is opposite in polarity to that applied to the oppose conductivity type region when using a potential applied to the other transistor emitter as a reference;

an electrode on the one transistor emitter region for applying an electrical potential thereto that is similar in polarity to that applied to the insulated gate electrode; and an electrode on the other transistor emitter region for applying an electrical potential thereto that is intermediate the electrical potential applied to the opposite conductivity type region and the one transistor emitter region;

whereby, after the aforesaid electrical potentials are applied to said emitter region electrodes, the aforesaid electrical potential can be applied to the gate electrode of the IGFET to turn on the thyristor, and the aforesaid electrical potential can be applied to the opposite conductivity type region to turn off the thyristor.

3. A gate-controlled thyristor that not only has an IGFET for turn-on but also an IGFET and a pinch resistor for turn-off, the thyristor comprising:

a semiconductor body containing integrated bipolar PNP and NPN transistors that form a thyristor for producing an integral pinch resistor that can pinch off electron current flow through the PNP transistor base region;

a first insulated gate electrode on said body, extending from emitter to collector regions of the NPN transistor, so as to form an integral enhancement type n-channel IGFET electrically in parallel with the NPN transistor emitter and collector regions;

a first P-type island-like region disposed within the PNP transistor base region, noncontiguous the PNP transistor emitter and collector regions for producing a pinch resistor with respect to electron flow in the PNP transistor base region;

a second P-type island-like region disposed within the PNP transistor base region, noncontiguous the PNP emitter and collector regions;

an electrode on said second P-type island-like region, for applying a given electrical potential thereto;

a second insulated gate electrode on said body extending from the first P-type island-like region to the second P type island-like region, so as to form an integral enhancement type P-channel IGFET on the PNP transistor base region, which IGFET can provide a low resistance electrical connection between the first P-type island-like region and the electrode on the second P-type island-like region;

an electrode on the PNP transistor emitter region; and an electrode on the NPN transistor emitter region;

effective, after applying a higher electrical potential than said given electrical potential to the NPN transistor emitter electrode and a still higher electrical potential to the PNP transistor emitter electrode, to allow an electrical potential higher than that applied to the NPN transistor emitter electrode to be applied to the gate electrode of the first IGFET and turn on the thyristor by latching the PNP and NPN transistors, and to allow an electrical potential lower than that applied to the NPN transistor emitter electrode to be applied to the gate of the second IGFET to turn off the thyristor by pinching off electron flow through the base region of the PNP electron flow through the base region of the PNP transistor.

4. A dual gate thyristor that not only has low on-resistance but also has rapid turn-off even while maintaining voltages applied to its anode and cathode, the thyristor comprising:

a semiconductor body containing integrated bipolar PNP and NPN transistors in which the base and collector of the PNP transistor respectively also form the collector and base of the NPN transistor to form a bipolar regenerative switching device;

a P-type emitter region centrally disposed on a base region surface of the PNP transistor;

a first annular P-type region in the PNP transistor base-NPN collector region that surrounds the PNP transistor emitter region;

a second annular P-type region in the PNP transistor base-NPN collector region that substantially completely surrounds the PNP transistor base-NPN transistor collector region in a plane substantially perpendicular to the direction of current flow in the PNP transistor collector-NPN transistor base region without intersecting the PNP transistor emitter region, the first annual P-type region or the PNP transistor collector-NPN transistor base region;

an anode on the PNP transistor emitter region;
a cathode on the NPN transistor emitter region;
an electrode on the first annular P-type region, for applying a voltage more negative than applied to either of the anode or cathode;
a dielectric film on the body extending from the NPN transistor emitter region to the NPN transistor collector-PNP transistor base region;
a turn-on electrode on the dielectric film for forming a conductive N-type channel beneath the dielectric film between the NPN transistor emitter and collector regions;
an internal resistance in the PNP transistor collector-NPN transistor base retion between the NPN transistor emitter and collector regions, which resistance is significant compared to conduction characteristics of the N-type channel;
a dielectric film on the body extending from the first annular P-type region to the second annular P-type region; and
a turn-off electrode on the last mentioned dielectric film for forming a conductive P-type channel beneath the dielectric film from the first annular P-type region to the second annular P-type region;
whereby a voltage applied to the turn-on electrode that is positive with respect to that applied to the cathode can induce a latch-up of the transistors for regenerative switching and a voltage applied to the turn-off electrode that is negative with respect to that applied to the cathode not only suppresses such latch-up but also forms a space charge region in the PNP transistor base-NPN transistor collector region that pinches off electron current flow through the last mentioned region.

* * * * *